United States Patent
Lee et al.

(10) Patent No.: US 6,629,812 B1
(45) Date of Patent: Oct. 7, 2003

(54) METHOD AND APPARATUS FOR CIRCULATING PALLETS IN AN ELEVATOR UNIT OF THE MODULE IC HANDLER

(75) Inventors: Sang Soo Lee, Choongchungnam-do (KR); Wan Gu Le, Choongchungnam-do (KR); Jong Won Kim, Kyungki-do (JP); Hee Soo Kim, Kyungki-do (KR); Young Hak Oh, Kyungki-do (KR); Dong Chun Lee, Seoul (KR)

(73) Assignee: Mirae Corporation, Chanan-si (KR)

( * ) Notice: Subject to any disclaimer, the term of this patent is extended or adjusted under 35 U.S.C. 154(b) by 0 days.

(21) Appl. No.: 09/455,467

(22) Filed: Dec. 6, 1999

(30) Foreign Application Priority Data

Dec. 9, 1998 (KR) .............................. 98-54001

(51) Int. Cl.[7] .............................. B65G 60/00
(52) U.S. Cl. .............................. 414/788.8; 414/331.11; 414/795.3; 414/796.7; 414/788.4
(58) Field of Search .............. 414/331.07, 331.08, 414/331.09, 331.1, 331.11, 331.16, 331.17, 331.18, 788.4, 788.7, 788.8, 795.3, 796.7

(56) References Cited

U.S. PATENT DOCUMENTS 4,588,341 A  *  5/1986  Motoda ............... 414/788.8 X

FOREIGN PATENT DOCUMENTS

DE          2153070       *  5/1973  .............. 414/788.8

* cited by examiner

Primary Examiner—Janice L. Krizek
(74) Attorney, Agent, or Firm—Fleshner & Kim, LLP

(57) ABSTRACT

A module IC handler used for testing module Ics is disclosed in which the handler enables loading and unloading operations for module ICs, without further elevating pallet over an installation plate, and provides sequential transferring operations for the pallet on which test or customer tray is placed. To this end, after all module Ics 1 are loaded from the test tray 6 exposed to the loading or unloading position 19 or 26 by the loading and unloading elevator units 18a, 18b, or the test-finished module Ics are filled in the customer tray 17, the pallet 5 is moved to a rotation position 30 by a transfer 31, and then can be circulated to an upper side of the loading or unloading elevation plate 36 by the downer 32.

27 Claims, 19 Drawing Sheets

METHOD AND APPARATUS FOR CIRCULATING PALLETS IN AN ELEVATOR UNIT OF THE MODULE IC HANDLER

BACKGROUND OF THE INVENTION

1. Field of the Invention

The present invention relates to a module IC handler used for automatically handling the module ICs throughout test processes for the module ICs, and more particularly to a method and apparatus for circulating pallets in an elevator unit of the module IC handler and which sequentially transfers pallets containing test or customer trays to a loading position or an unloading position.

2. Description of the Conventional Art

Typically, a module IC 1 refers to, as shown in FIG. 1, a structure provided with a substrate whose one side or both sides thereof is used for for fixedly mounting a plurality of ICs and electric components, for example, by soldering, and has a function for extending a capacity when it is coupled to a mother substrate.

Such a module IC provides higher added-value when sold, as compared with individual sale of each IC as a final product. To this end, the IC manufactures tend to develop it as a main product and sell it.

However, the module IC as a product available from the market is relatively expensive and thus entails higher reliability as an important factor therefor. This requires strict quality test for passing only product determined to be good, and otherwise, discarding all the module ICs determined to be not good.

In the prior art, there has been no apparatus for automatically loading the module ICs as final products into a test socket, testing the same, classifying into respective categories depending upon the test results and then unloading the classified modules into the customer trays (not shown).

To test the final product of module IC, the operator manually has to pick up one piece of the module IC from the test tray in which the module ICs are contained therein, load it into a test socket, conducts the tests for a time period preset, and finally classify the module IC depending upon the test result in order to put it the customer tray. This results in lower productivity due to manual work.

Further, such tedious repeated manual work contributes to lower productivity.

Inside of the test trays and the customer trays, respectively, is provided with a plurality of insertion slots for vertically putting therein the module IC 1.

To solve such a problem, the inventors developed an automatic module IC handler adapted to test the module ICs, which was disclosed in Korean patent and utility model applications (available from Mirae Co. "MR 7100, MR 7200").

FIGS. 2 to 4 show a disclosure of Korean utility model application serial No 96-8320, 1996.

FIG. 2 is a front view showing the prior apparatus, FIG. 3 is a side view with some portions the FIG. 2 apparatus omitted, and FIG. 4 is a plan view of the apparatus shown in FIG. 2.

There is shown an upward and downward movable elevator 4 coupled to a guide rod 3 fixed at a support plate 2, and having therein pallets a4 operable like a drawer.

The pallet positioned at a loading side among the pallets 5 is used to carry thereon the test tray 6 containing the module ICs to be tested, whereas the pallet positioned at an unloading side used to carry thereon the customer trays 7 containing the test-finished module Ics.

Between the support rods 3 is disposed a lead screw 9 rotated by a drive of the motor 8 and into which a guide block 10 fixed at both sides of the elevator 4 is screwed.

A retractable slider 13, which is moved along a guide rail 12, is disposed over an installation plate 11 disposed in the loading side and unloading sides, respectively. Further, the slider 13 is provide with a pair of fingers 15 being able to be widen or narrowed by an action of the cylinder 14. Also, the pallet 5 has one surface oppositely facing the slider 13 and at which a suspension protrusion 5a is formed.

The apparatus thus constructed begins to operate when the test trays 6 fully filled with the module ICs to be tested are, respectively, placed on the pallets 6 in the loading side elevator, and also when empty customer trays 7 to be filled with the test-completed module ICs are placed on the pallets 5 in the unloading side elevator.

With the pair of fingers 15 opened by an OFF state of the cylinder 14 installed in the slider 13, an activated motor 8 elevates the elevator 4. If any one of pallets accommodated in the elevator reaches a horizontal plane of the slider 13, the slider 14 moves toward the pallet 5 as seen left in FIG. 4, at this time, the cylinder 14 activated shrinks the fingers 16 to hold the pallet 5 the slider 13.

Under such circumstances, returning to an initial state of the slider 13, the slider 13 is drawn to the loading or unloading position as seen right in FIG. 4. Therefore, the loading side picking-up means 16 sequentially picks up the modules ICs contained in the test tray 6 to then load it into the test socket or in carrier.

On the other hand, after all of module ICs in the test tray 6 being picke-up, the slider 13 pushes the pallet toward its associated elevator 4. With the holding state being released, the lead screw 9 into which a guide block 10 fixed at both sides of the elevator 4 is screwed is rotated by the motor to elevate the elevator 4 by one step.

The second pallet below the top pallet being thus held by the fingers 15 disposed in the slider 13 is drawn out. Therefore, it becomes possible to repeat the procedures as mentioned above.

However, although the prior apparatus as discussed above has an advantage in that the test or customer trays 5 or 6 may be stocked in the pallet 5 in the elevator 4 thus allowing automatic loading or unloading of the module ICs, the apparatus has the following drawbacks.

Firstly, to pull out the pallet 5 in the elevator, it requires that the elevator 4 be each time elevated by one step above the installation plate 11, which results in an increase in height of the apparatus.

Secondly, to load the module ICs or to unload the test-completed ICs into the customer tray, it requires that the slider 13 is moved to hold the pallet 5 in the elevator 4 by the fingers 15 and the pallet held is then to be moved to the loading position. Thus, a total area occupied by the apparatus becomes wider, which results in an increase in the installation area.

Finally, after all of the module ICs in the test tray 6 having been placed on each pallet 5 are loaded, or all of the test-finished module ICs in the customer tray 7 are unloaded, the operator lowers the elevator 4 up to the bottom dead point, pulls the tray from the pallet and then puts individual new test or customer trays into each pallet 5 one by one. Thus, a stand-by interval is required during which the elevator returns, thus resulting in lower availability of the high-cost apparatus.

SUMMARY OF THE INVENTION

Therefore, it is an object of the present invention to enable loading and unloading operations for module ICs, without further elevating pallet over an installation plate, and to provide sequential transferring operations for the pallet on which test or customer tray is placed.

It is another object of the present invention to minimize a stand-by interval introduced by the loading and unloading operations for the test and customer trays.

Theses objects are accomplished by the present invention provding, for a module IC handler including an elevator unit, a method for circulating pallets in the elevator unit comprising the steps of: transferring a transfer having holding means to a position over a pallet positioned at a loading or unloading position and, simultaneously, upwardly moving a downer positioned at a bottom dead point to a top dead point; downwardly moving the holding means to hold the pallet and thereafter upwardly moving the holding means carrying the pallet; moving downward the holding means after the transfer is transferred to a rotation position, placing the pallet on the top surface a downer, and returning to an initial state of the holding means; releasing locking means to which the pallets at the loading or unloading position are locked, subsequently opening a stopper for preventing the pallets being dropped when simultaneous upward movement of the plural pallets placed on a loading or unloading elevation plate are made, and exposing to the loading or unloading position the top pallet; the locking means locking the top pallet exposed; returning to an initial state of said stopper opened, and moving downward to the bottom dead point the elevation plate with the bottom plate which is suspended by the stopper; aligning the top level of the pallet placed on the descending downer with the top level of the loading side or unloading side elevation plate; and transferring the pallet placed on the downer to the top surface of the loading side or unloading side elevation plate.

Also, according to another aspect of the present invention accomplishing the above objects, there is provided for a module IC handler including an elevator unit, an apparatus for circulating pallets in the elevator unit comprising: loading side and unloading elevation units each having an upward and downward movable elevation plate installed between parallel side plates; first driving means for upwardly moving each elevation plate; a plurality of pallets each having a top surface on which a test tray or a customer tray is placed, and which are vertically deposited on each elevation plate; stopper means installed oppositely to each side plate, for controlling the descending action of the pallet; locking means installed, respectively, at loading and unloading positions both of which are in an upper side of the side plate, for locking the top pallet being exposed to the loading or unloading position; a rotation position between the elevator units in respective loading and unloading sides, for downwardly moving the pallet; a transfer for holding the pallet at the loading or unloading position and transferring same to the rotation position; an upward and downward movable downer installed at the rotation position, for transferring the pallet moved by the transfer to the bottom dead point; second driving means for upwardly moving the downer; and distributing means disposed at the bottom dead point of the rotation position, for transferring the pallet moved down by the downer to the elevator unit of the loading or unloading side.

BRIEF DESCRIPTION OF THE DRAWINGS

FIGS. 8a and 8b are vertical sectional views for explaining the state that fingers hold a top pallet, in which FIG. 8a shows the state the fingers are opened, and FIG. 8b shows the state the fingers shrink by the driving of a cylinder to hold the pallet.

FIGS. 9a to 9h are schematic views for showing a circulation path of the pallet, respectively, in which FIG. 9a shows an initial state at which each pallet is positioned at respective loading and unloading positions, FIG. 9b shows the state in which the transfer is moved to a position over the loading position in order to hold the pallet having been at a loading position, FIG. 9c shows the state in which the fingers of the transfer are moved downward to the bottom dead point, FIG. 9d shows the state in which a downer is elevated up to the top dead point and the transfer holding the pallet is moved to a position over the downer, FIG. 9e shows the state in which the fingers at the loading position are opened and a plurality of pallets are elevated up to the top dead point by an elevation plate, FIG. 9f shows the state in which a pair of fingers shrink to hold the top pallet and the elevation plate is moved downward to the bottom dead point, FIG. 9g shows the state in which an empty pallet is placed on a top surface of a rail, and FIG. 9h shows the state in which the empty pallet placed on the rail is transferred to a position over the loading side elevation plate.

DETAILED DESCRIPTION OF THE INVENTION

Referring to FIGS. 5 to 11, a preferred embodiment of the present invention will be described in detail.

Figure 1:
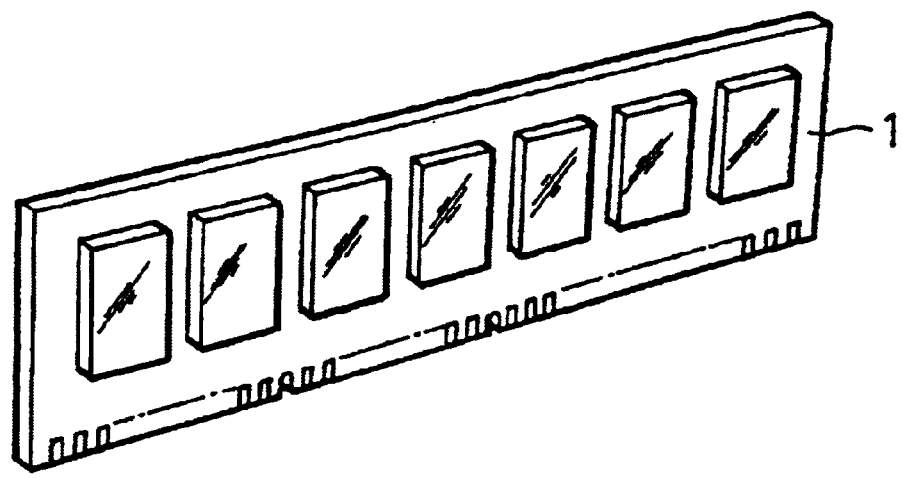
FIG. 1 is a perspective view of a typical module IC.
Figure 2:
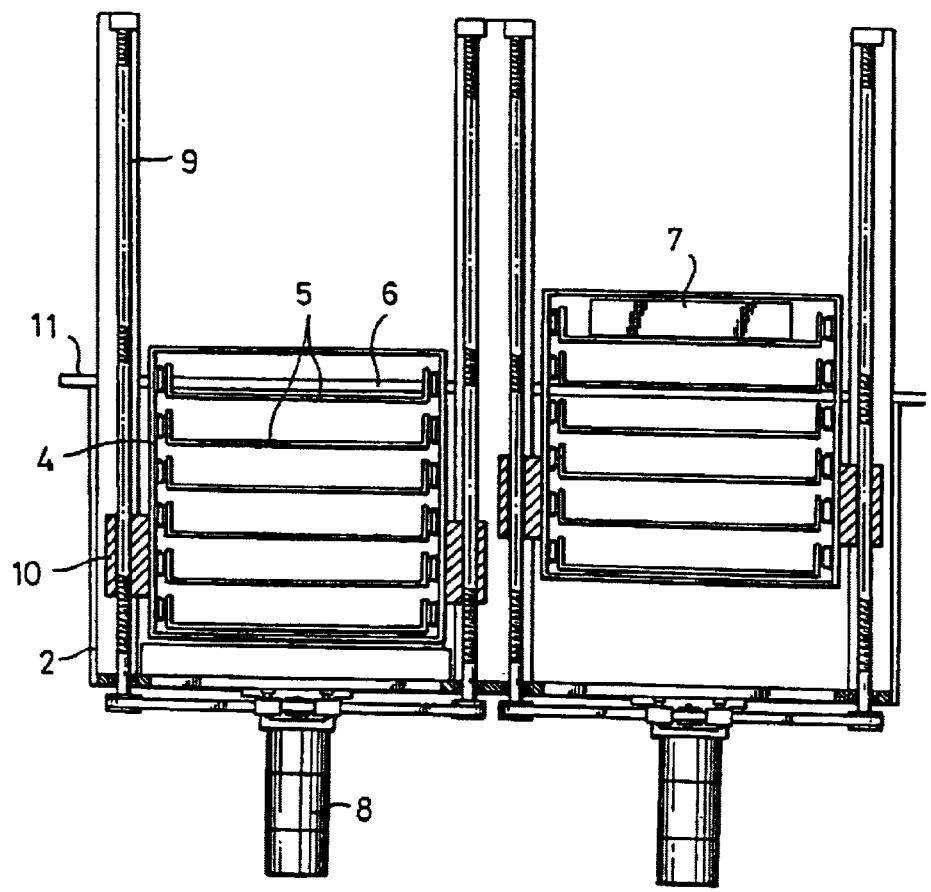
FIG. 2 is a front view of the prior apparatus.
Figure 3:
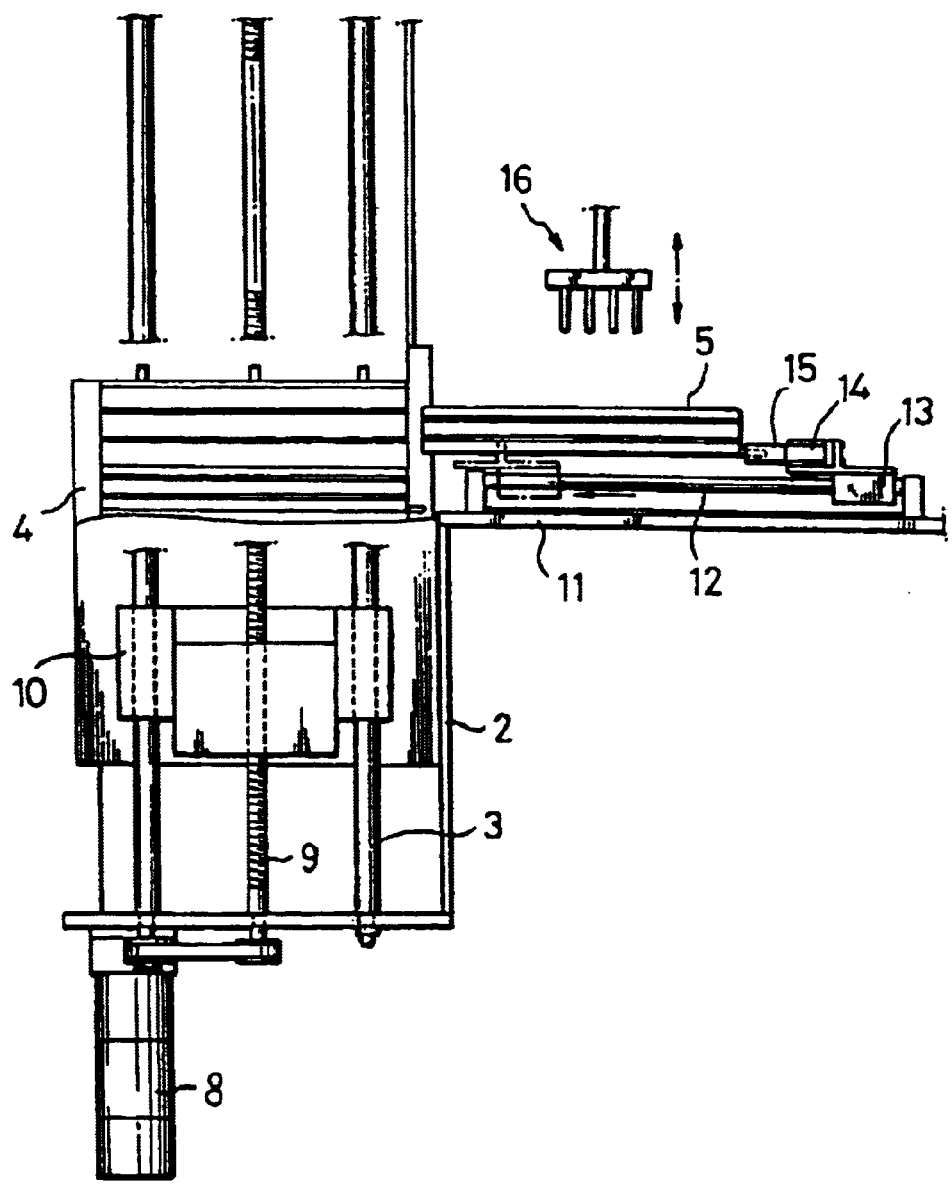
FIG. 3 is a side view with some portions in FIG. 2 omitted.
Figure 4:
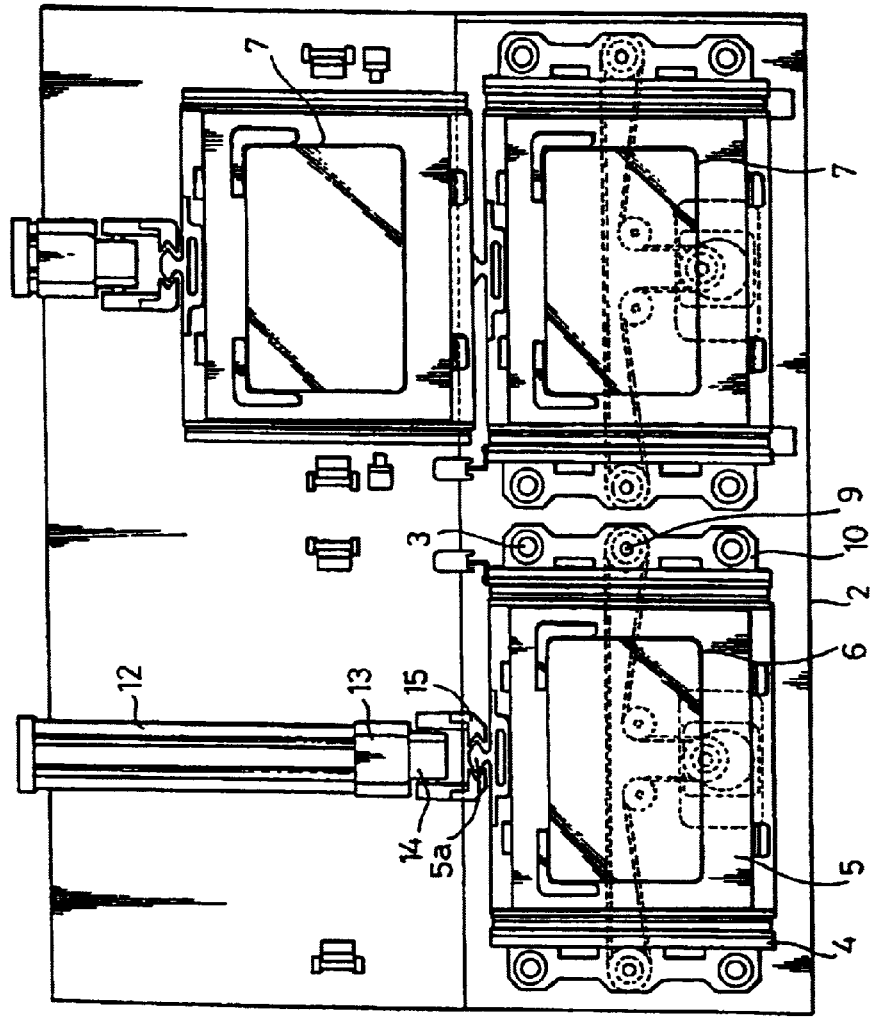
FIG. 4 is a plan view of the apparatus shown in FIG. 2.
Figure 5:
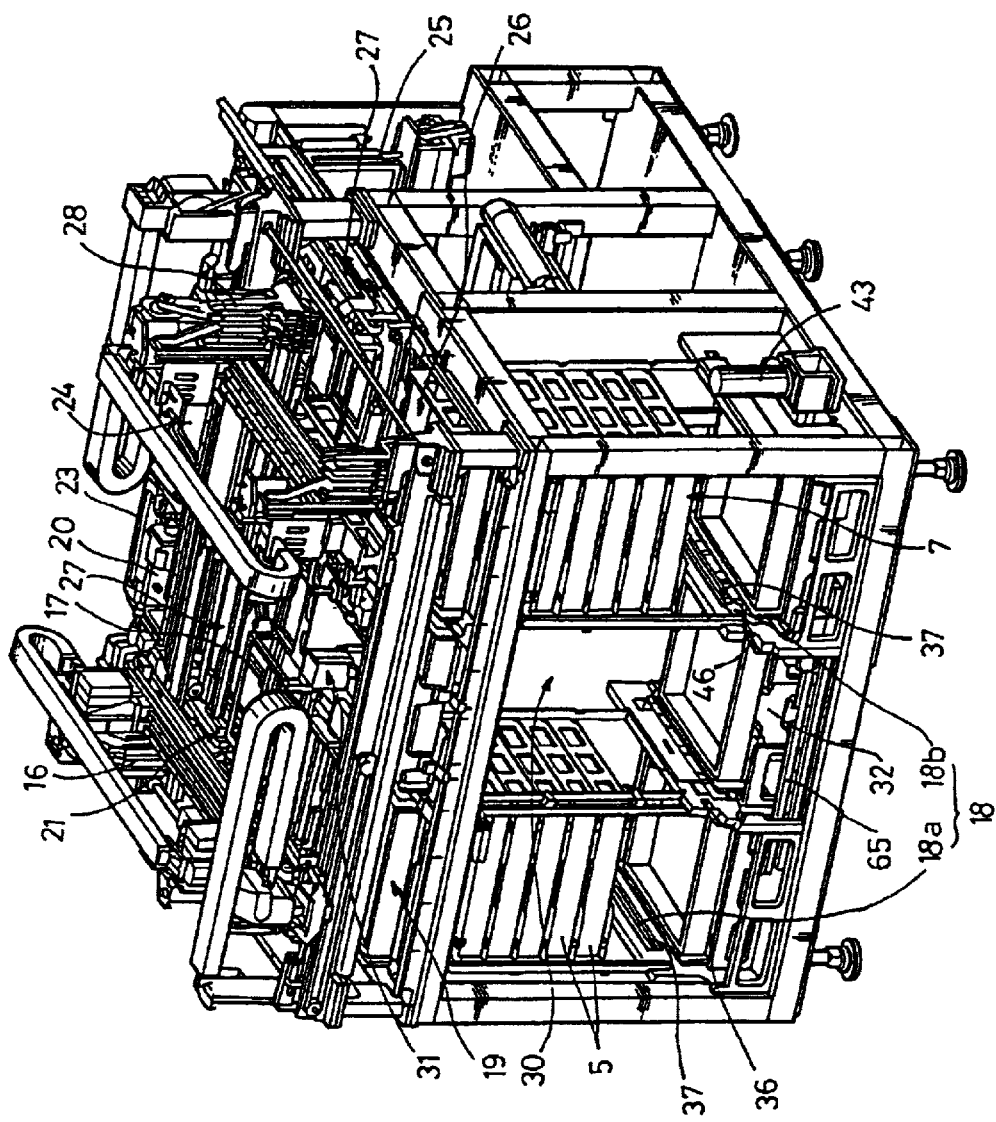
FIG. 5 shows a perspective view of a module IC handler to which the present invention is applied.

FIG. 5 shows a perspective view of a module IC handler to which the present invention is applied. Briefly, the structure of the module IC handler will be explained below.

The handler includes:

an elevator unit 18 used to elevate a pallet 7 on which a test tray 6 is placed, by sequentially one step when a module ICs 1 contained in the test tray 6 is loaded in a carrier 17, or to lower the pallet when the test-finished module IC is classified into a customer tray 7 and then unloaded;

picking-up means 16 in a loading side, for sequentially holding the module IC 1 in the test tray to load the module IC to the carrier 17 disposed at the loading position 19;

first transferring means 21 for horizontally tranferring the carrier 17 into which the module IC to be tested is loaded to a loading side rotator 20;

a loading side rotator 20 for rotating the carrier by 90-degrees when the carrier is transferred by the first transferring means;

a heating chamber 23 disposed immediately blow the loading side rotator, and for heating the module IC loaded in the carrier at a temperature suitably selected for the tests when the carrier is sequentially transferred;

transferring means (not shown) for sequentially transferring the carrier in the heating chamber in a step by step basis;

a test site 24 located at one side of the heating chamber, in which tests are conducted for a preset time interval, when the module IC suitably headted according to the test conditions arrives and then is pushed toward the test socket;

an unloading side rotator 25 located at one side of the test site, for rotating the carrier by 90-degrees such that the carrier maintains an its horizontal state, when the carrier arrives with the test-finished module Ics;

second transferring means 27 for horizontally transferring the carrier in the unloading side rotator into the unloading position 26;

an unloading side picking-up means 28 for holding the module IC from the carrier having been transferred by the second transferring means, classifying the module IC depending on the test results, and unloading it into the customer tray 7; and third transferring means 29 for horizontally transferring an empty carrier to the loading position 19, the empty carrier being obtained by unloading all module Ics in the carrier.

The module IC handler as structured above needs to be provided with the elevator unit 18 which sequentially elevates and circulates the pallets 5 placing thereon the test trays 6 or the customer trays 7 for continued test processes.

The present invention is characterized in that all of the module Ics are loaded from the top pallet positioned at the loading or unloading position 19 or 26, when the plurality of pallets 5 are stocked in the loading side elevator unit 18a and the unloading side elevator unit 18b, respectively, or in that the pallet is circulated to a lower side of each elevator unit whenever the test-finished module IC is unloaded.

Referring to FIGS. 9a to 9h, schematic views for each showing the circulation path of the pallet are illustrated. The circulation route for the pallet 5 is as follows.

Figure 9A:
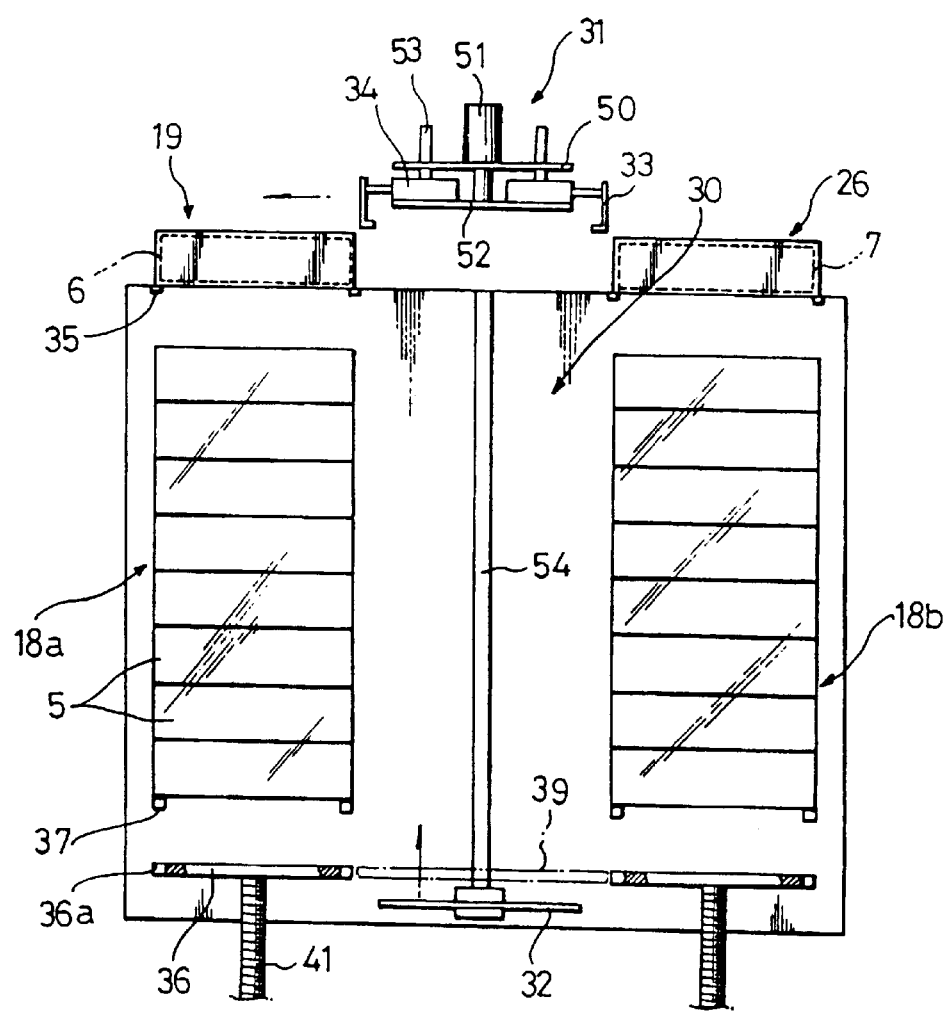

Referring to FIG. 9a, the apparatus starts up when the pallets are placed at loading and unloading positions 19, 26, respectively, wherein the pallets 5 at the loading position 19 is shown to include the test tray 6 in which the module ICs 1 to be tested are filled, and another pallet 5 at the unloading position 26 is shown to include the customer tray 7 in which the module ICs having been tested are accommodated.

Under such circumstances, the loading side picking-up means 16 (see FIG. 5) picks up and holds the module IC 1 from the test tray 6 placed at the loading position 19, and then the ICs held are sequentially loaded into the carrier 17. When there is no module IC to be held in the test tray, the pallet 5 at the loading position is transferred to a rotation position 30. At this time, the top pallet 5a in the loading side elevator unit 18a needs to be exposed to the loading position 19.

Figure 9B:
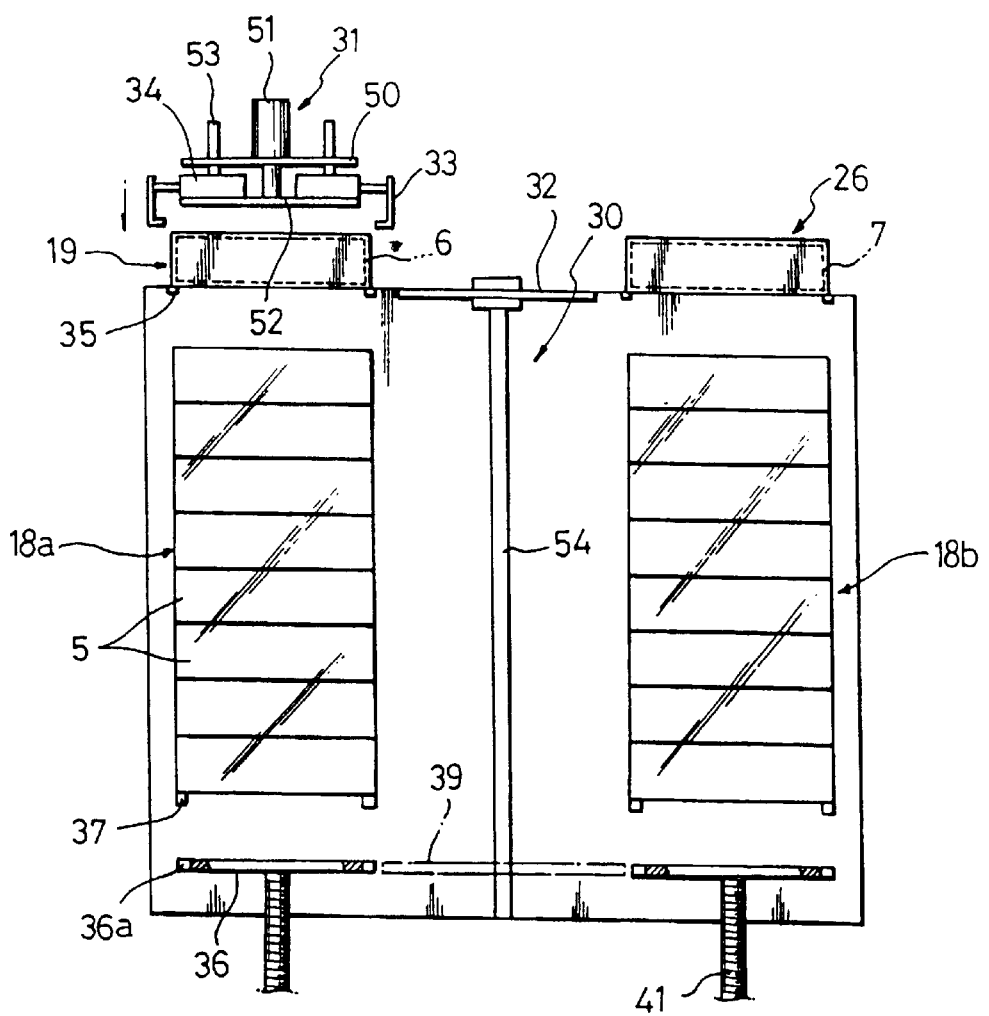

To this end, the transfer 31 which was at the rotation position 30 is moved, as shown in FIG. 9b, to a position over the pallet 5 placed at the loading position 19. Also, the downer 32, which is at a bottom dead point of the rotation position, ascends to an upper dead point of the rotation position.

It is noted that the movements of the transfer and the downer are accomplished by separate transferring means which will be described later.

When the transfer 31 is moved to the loading position 19, fingers 33 as a holding means remains still opened.

Figure 9C:
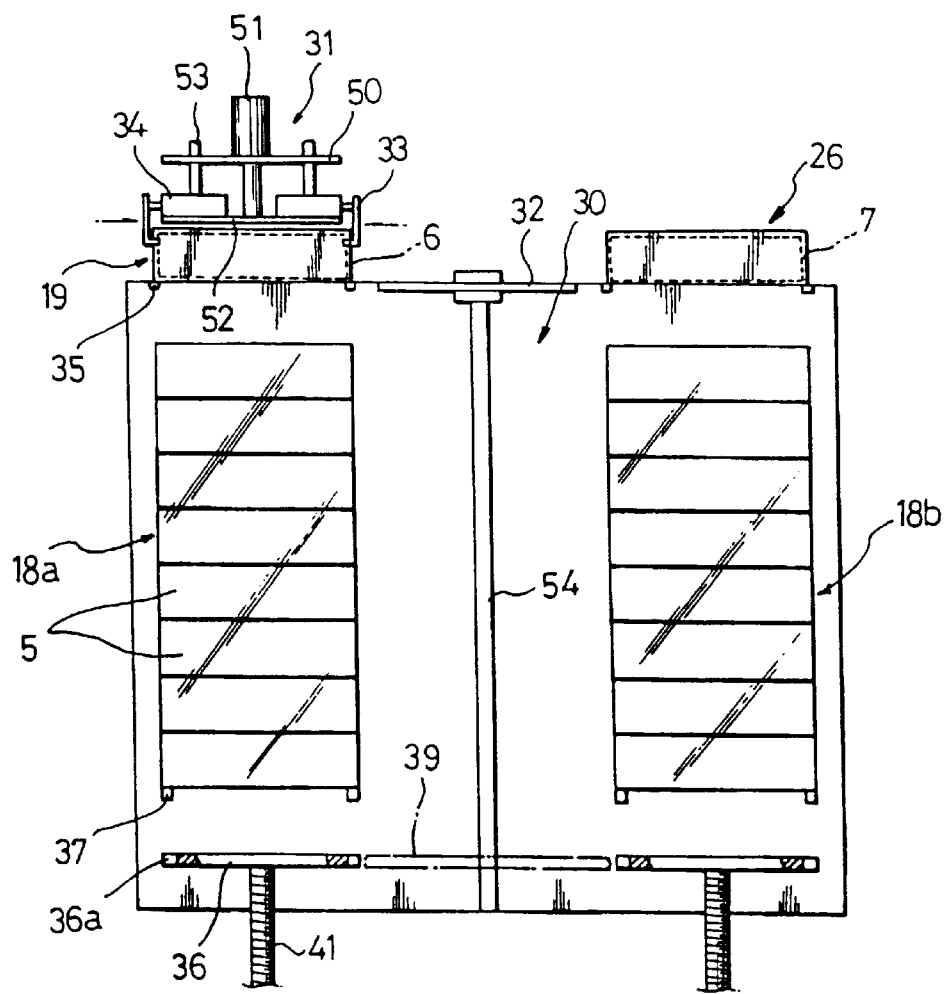

Under such circumstances, as shown in FIG. 9c, when the fingers 33 descend to their associated bottom dead point and thus reach a bottom surface of the pallet 5, a finger cylinder 34 drives a pair of fingers 33 so that each finger is inwardly moved toward each other. Therefore, the transfer 31 can achieve its holding operation for the pallet 5 being at the loading position 19.

Figure 9D:
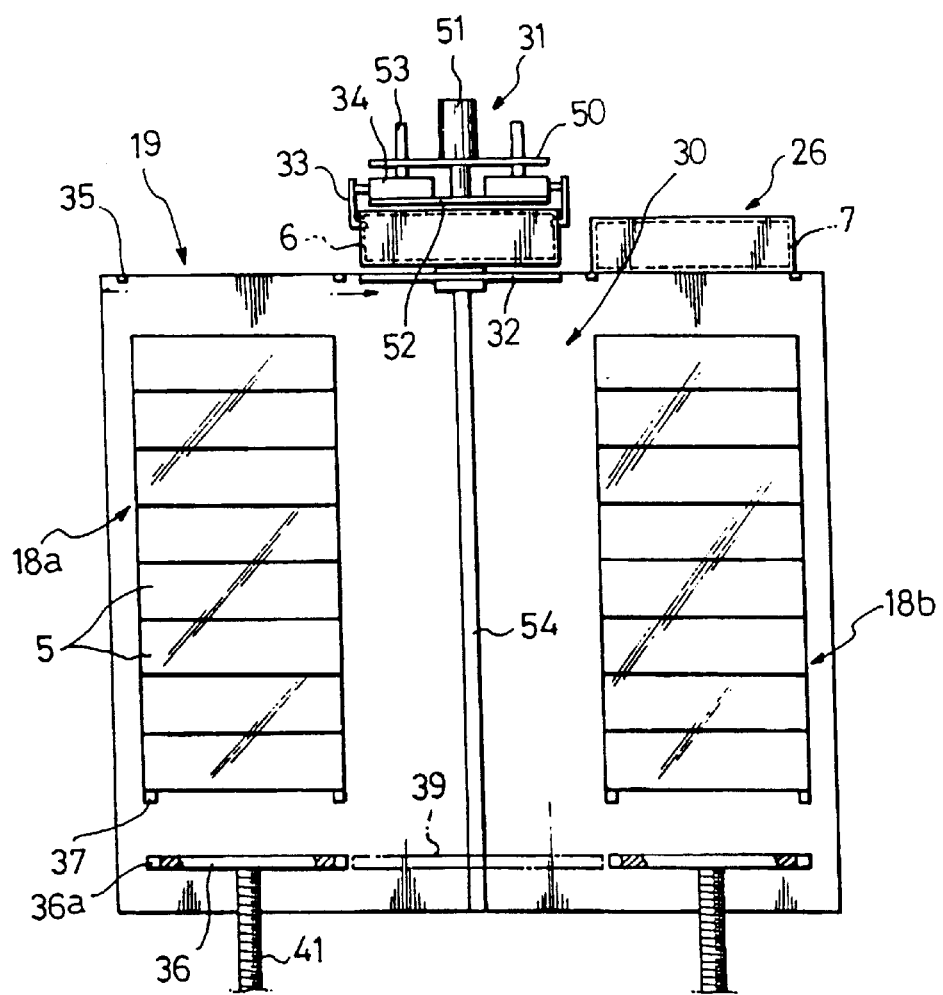

With the pallet held by the transfer 31 through such operations, the pallet is elevated up to the top dead point associated with the fingers 33, and then the transfer 31 is moved to a position over the downer 32 positioned at the top dead point of the rotation position 30, as shown in FIG. 9d.

After the pallet 5 having been at the loading position 19 is moved to the rotation position 30, fingers 35 of a locking means disposed at the loading position 19 (see FIG. 8a) are opened, and an elevation plate 36 of the loading side elevator unit 18a is moved upward up to the top dead point.

Thus, since a plurality of pallets 5 at the loading side elevator unit 18a are upwardly moved together, a top pallet 5 is exposed to the loading position 19.

With the upward movement of the elevation plate 36 as described above, the stoppers 37 are opened when a bottom pallet 5 held by stoppers 37 is released therefrom.

Figure 8A:
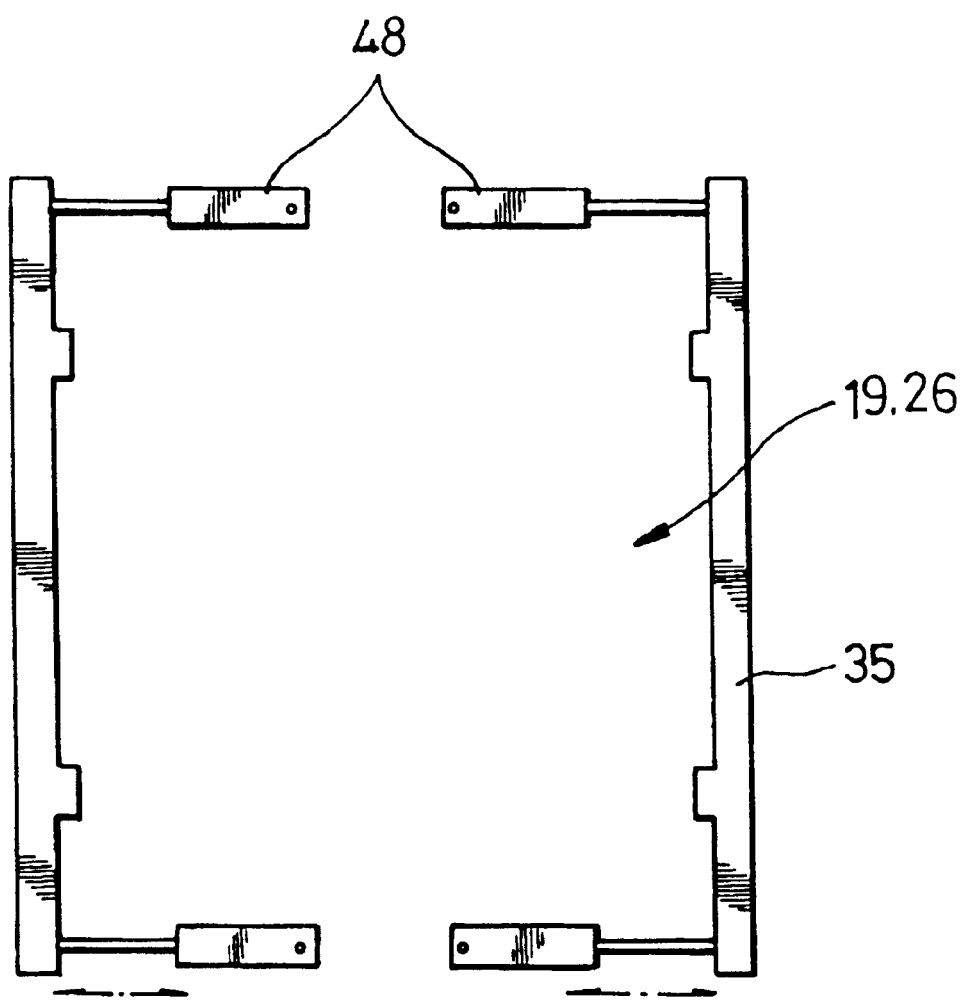
Figure 8B:
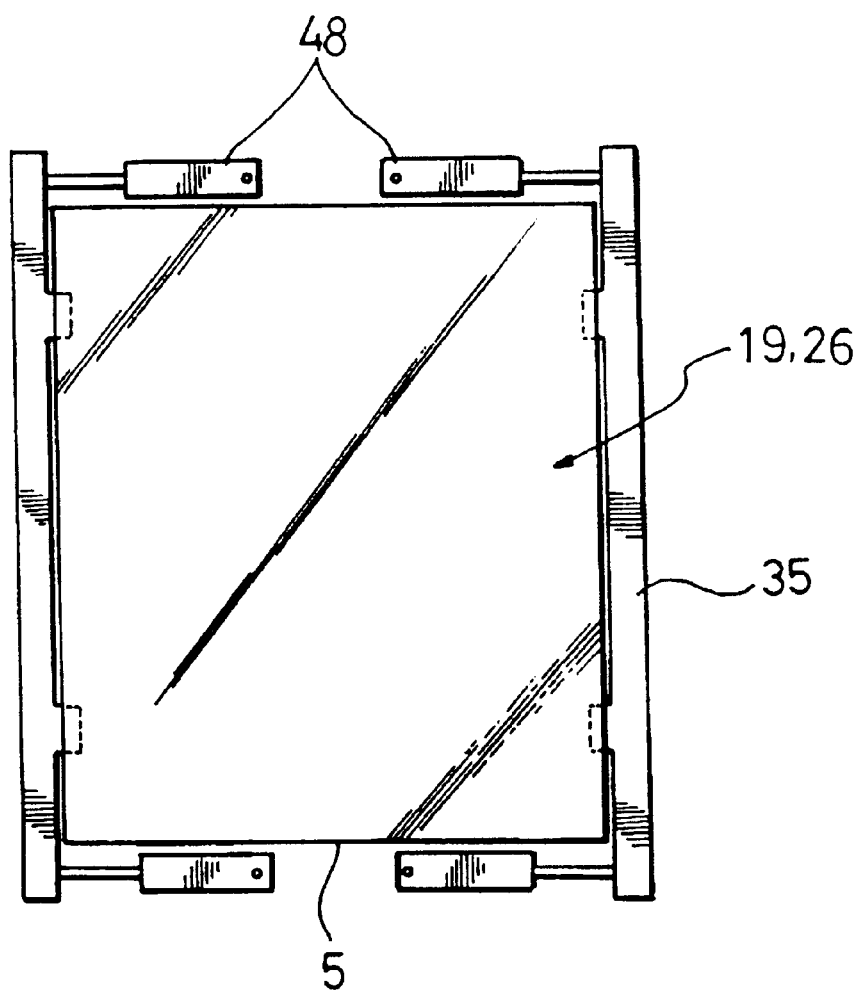

When the top pallet 5 is exposed to the loading position 19, the opened fingers 35 again shrink as shown in FIG. 8b, thereby the top pallet 5 is locked thereto.

Figure 9E:
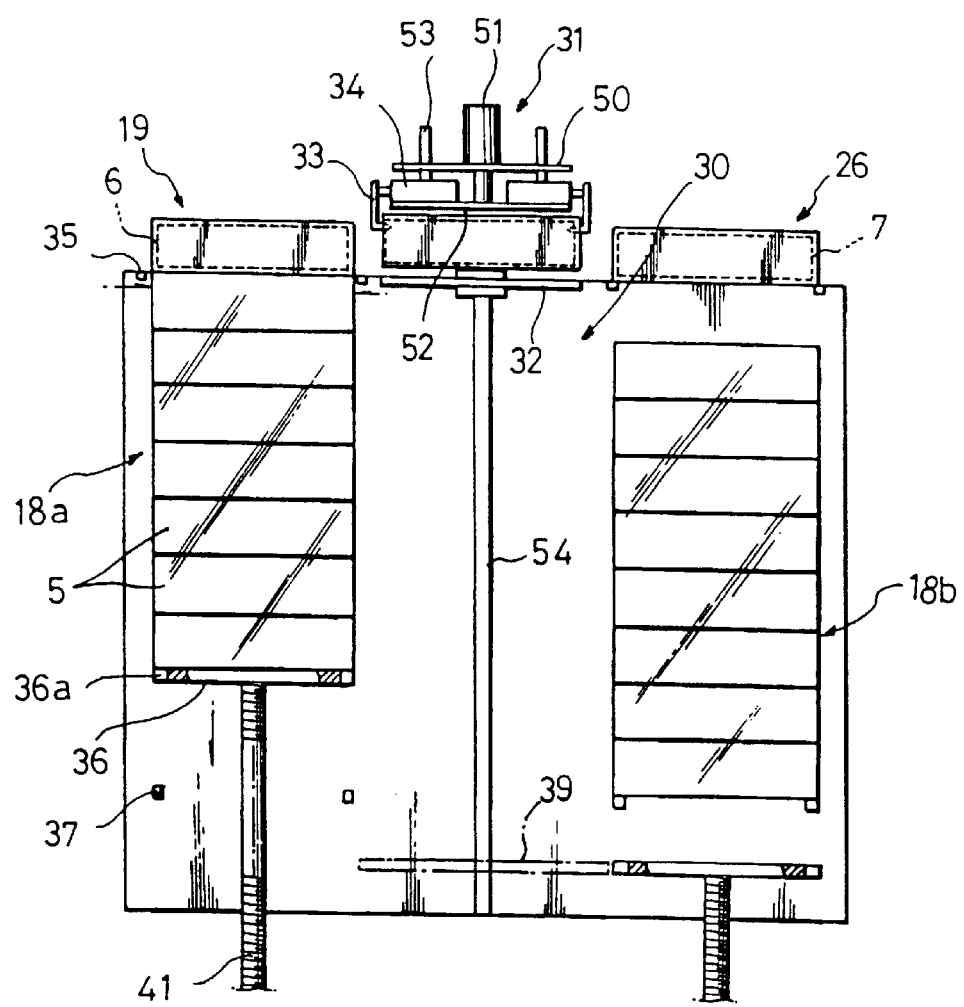
Figure 9F:
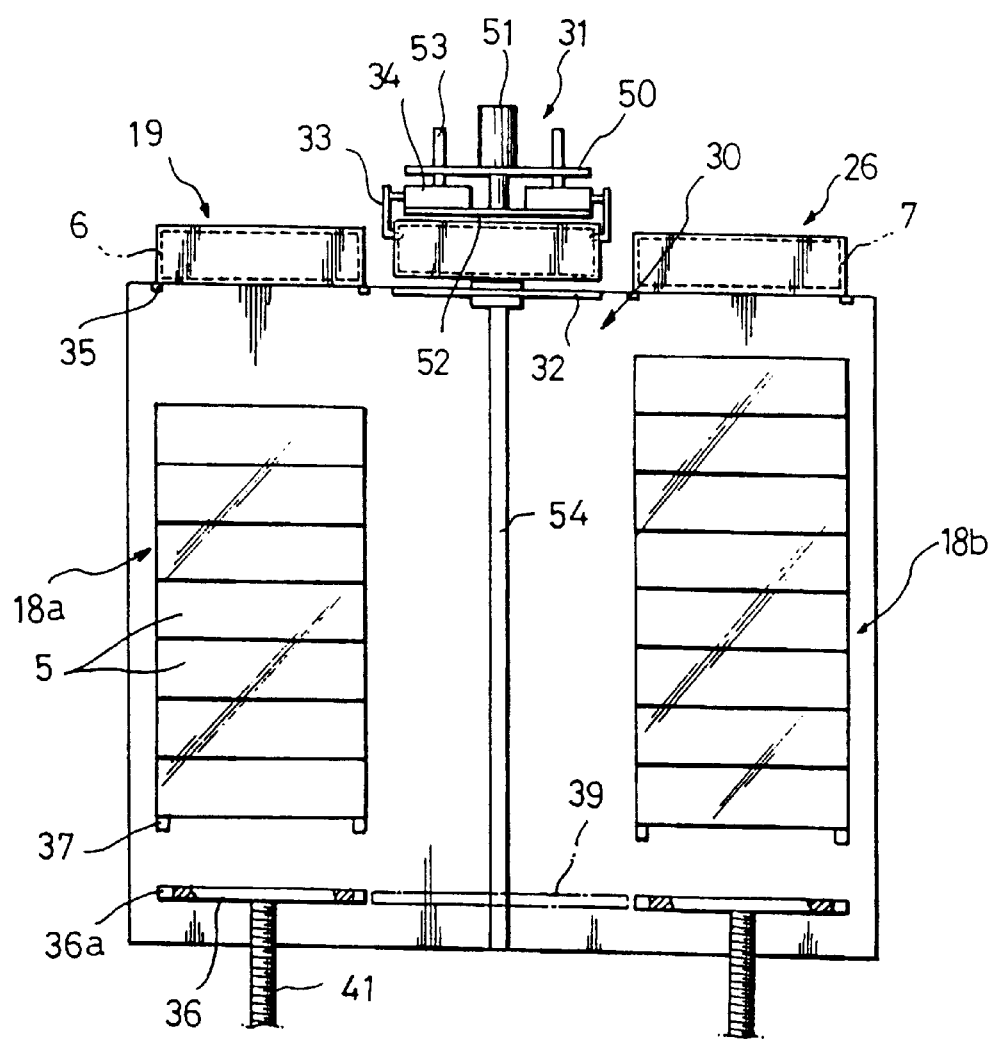

Thereafter, the elevation plate 36 at the top dead point descends to the bottom dead point as shown in FIG. 9f, and thus returns to its initial state. Prior to such operation, the stoppers 37 oppositely provided on a side plate and remained opened are retracted, and the descending of the bottom pallet 5 can thus be controlled during the descending of the elevation plate 36. Therefore, the descending operation of the pallet stops, and only the elevation plate 36 descends to the bottom dead point.

Since the module ICs 1 to be tested are contained in the test tray 6 of the pallet 5 being exposed to the loading position 19 resulting from the ascending of the elevation plate 36, the loading side picking-up means 16 becomes able to load the module ICs into the carrier 17.

Figure 9G:
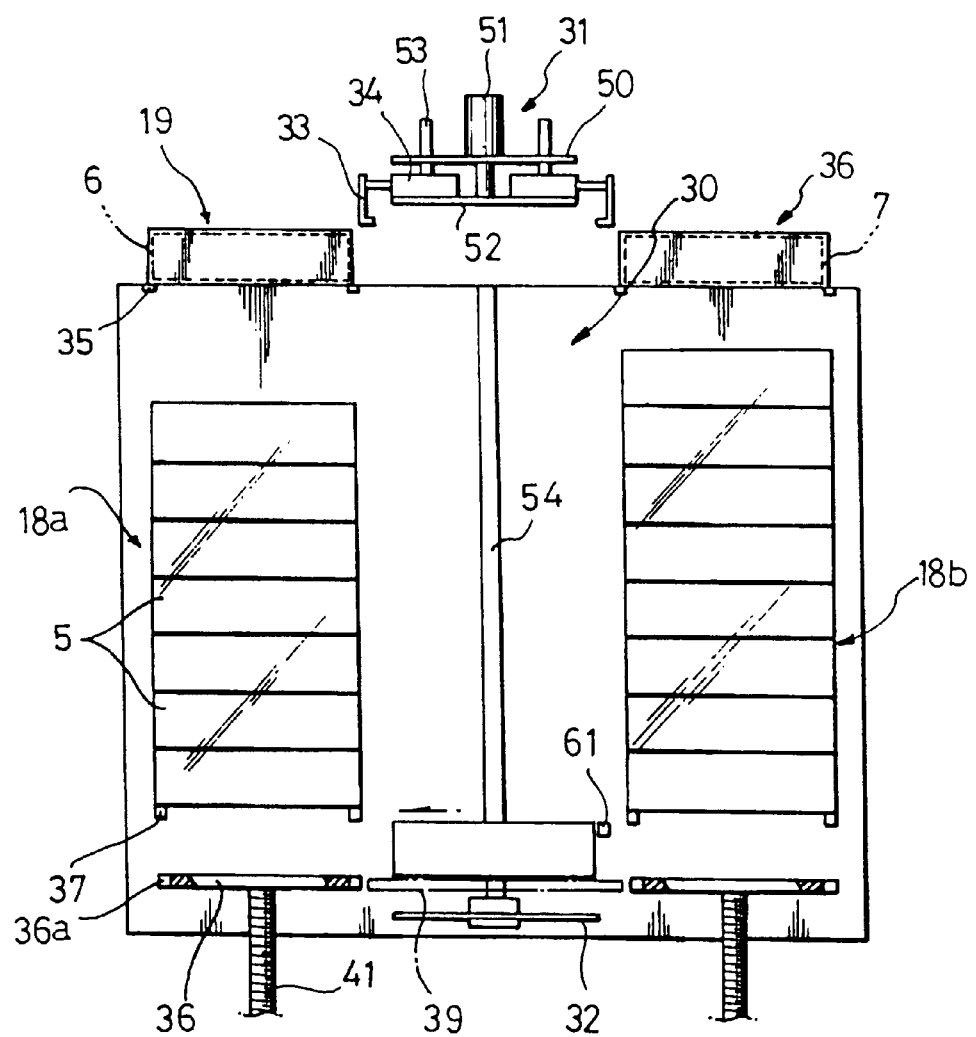

As shown in FIG. 9d, with the transfer moved to a position over the downer 32 at the top dead point, if the holding means descends to the bottom dead point to release the finger's holding state, the pallet 5 is placed on the top surface of the downer 32. Thereby, the downer 32 is downwardly moved to the bottom dead point by means of a driving means, as shown in FIG. 9g.

At this time, the fingers 33 are moved upward to the top dead point to resume their initial state.

After the pallet 5 moved by the transfer 31 is moved to the bottom dead point by the downer 32, the pallet 5 is placed on the top surface of a guide rail 39.

The movement of the pallet placed on the guide rail 39 onto the elevation plate 36 of the loading side elevator unit 18a requires a pusher 61 fixed at a slider 38 to be at a right side of the guide rail 39.

This can be done because a controller determines the positioning of the slider 38 by recognizing when the pallet 5 at the loading side descends and the pallet 5 at the unloading side descends.

Figure 9H:
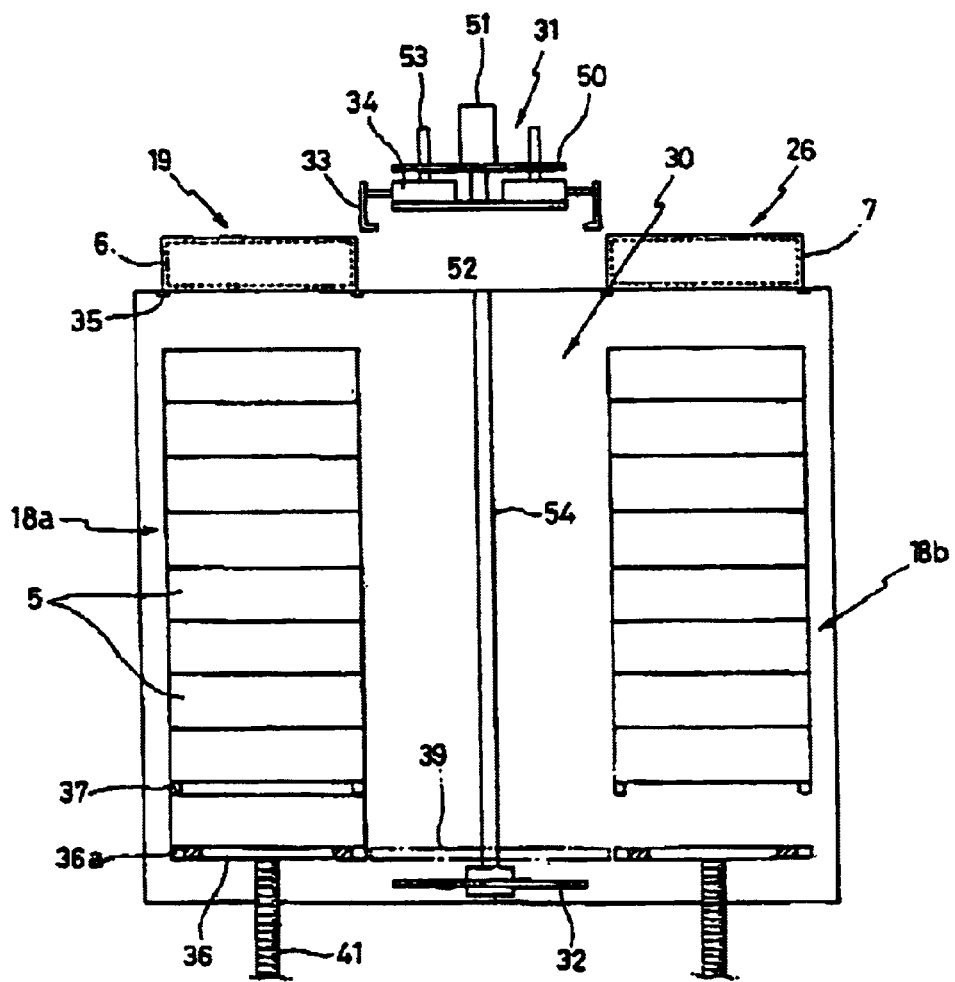

Thus, when the slider 38 is moved left as seen in the drawing, the pallet 5 placed on the guide rail 39 is correspondingly moved left as seen in the same figure. Therefore, the pallet 5 can be placed on the top surface of the loading side elevation plate 36, as shown in FIG. 9h.

As described above, the pallet 5 placed on the elevation plate 36 is elevated together with the bottom pallet 5 closely engaged therewith, during an ascending operation of the elevation plate 36 for eexposing the top pallet 5 to the loading position 19.

While one embodiment of the present invention is illustratively shown in which the transfer 31 is moved to the loading position 19 to hold the pallet 5, and the pallet thus held is placed on the top surface of the downer 32 and then circulated to the top surface of the loading side elevation plate 36, such procedures are similarly done in an unloading side. Therefore, the detailed explanation thereto will be omitted.

When the pallet 5 is circulated in a manner as mentioned above, the following steps therewith may be also performed, including positioning on the downer 32 the pallet 5 by downwardly moving the holding means of the transfer 31, and simultaneously, moving upward the elevation plate 36 being at the loading or unloading side.

Futhermore, it may be also simultaneously performed an operation for moving both the downer 32 and elevation plate 36 to the bottom dead point.

If such operations are performed, it produces an advantage that a time required to exchange the pallet 5 with others is much reduced.

The details of the apparatus for realizing one embodiment of the present invention are provided below.

Figure 6:
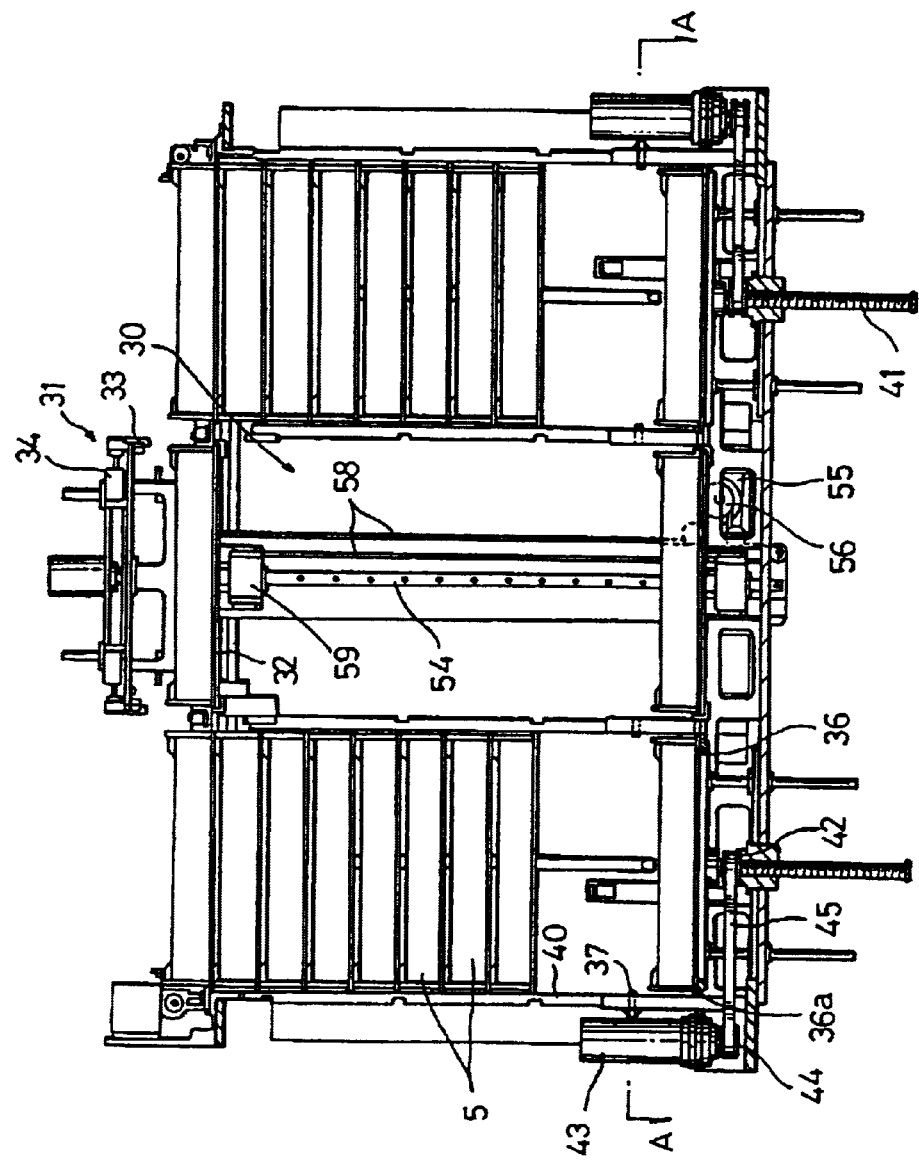
FIG. 6 is a vertical sectional view of an elevator unit.
Figure 7:
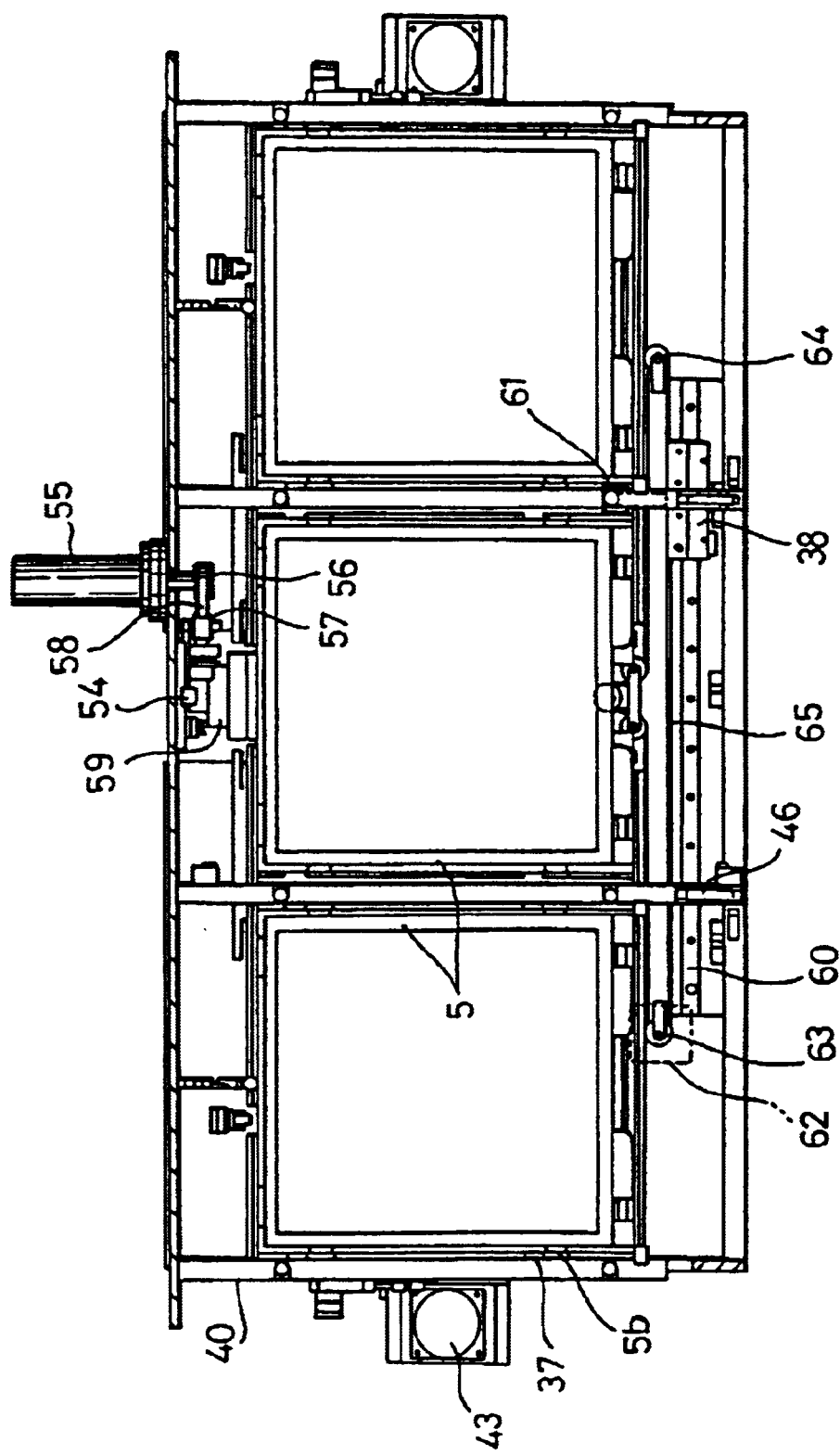
FIG. 7 is a sectional view taken along line A—A in FIG. 6.

FIG. 6 is a vertical sectional view of an elevator unit, FIG. 7 is a sectional view taken along line A—A in FIG. 6, and FIGS. 8a and 8b are vertical sectional views for explaining the state that the fingers hold the top pallet. According to the present invention, there is provided a upward or downward movable elevation plate 36 between a pair of side plates 40 constituting the loading side and unloading side elevator units 18a, 18b. An ascending/descending motion of each elevation plate 36 is done within a range set by a first driving means, during which the top pallet 5 is exposed to the loading or unloading position 19 or 26.

Referring to FIG. 6, the first driving means for elevating/lowering the elevation plate 36 installed in respective elevator units 18a, 18b comprises: a lead screw 41 fixed at a bottom surface of the elevation plate 36 and exposed to a lower part of each elevator unit; a driven pulley 42 screwed to the lead screw; a motor 43 for generating a rotational force to the driven pulley; and a timing belt 45 for carrying the rotational force from the motor to the driven pulley through the driving pulley 44.

Over the elevation plate 36 are positioned a plurality of pallets 5 each used to place the test tray 6 or the customer tray 7 therein. Each side plate 40 has a stopper means installed oppositely each other and which operates to stop the descending motion of the bottom pallet 5 although the elevation plate 36 is downwardly moved up to the bottom dead point. Therefore, the control of a descending motion of the pallets 5 can be made by the stopper means.

Such a configuration advantageously provides a space allowing a single one pallet to be accommodated between the pallet 5 suspended by the stopper means and the elevation plate 36.

This is provided for transferring the pallet downwardly moved by the downer 32 to the place on the elevation plate to a position over the elevation plate, prior to the ascending of the elevation plate 36.

The stopper means may consist of: a stopper 37 installed oppositely each other on each side plate 40; and a cylinder 46 installed at the side plate, wherein the stopper 37 horizontally movable is used to hold a bottom surface of the bottom plate 5 or to release the locking state, and wherein the cylinder 46 is used to supply the horizontal motion force to the stopper.

Cut grooves 5b, 36a are, respectively, formed at sites commonly sharing both sides of the pallet 5 positioned on each elevation plate 36 and on both sides of the elevation plate 36, and are formed to pass through the retractable stopper 37 with respect to the side plate 40.

This provides a smooth ascending motion of the elevation plate 36 which results from the opened stopper not interfering with the movements of the elevation plate and the pallet placed thereon. Furthermore, such configuration allows only elevation plate 36 to pass the stopper 37, and the bottom pallet 5 to be suspended by the stopper, when the elevation plate is downwardly moved. Thus, the descending of the pallets can be controlled.

Figure 11:
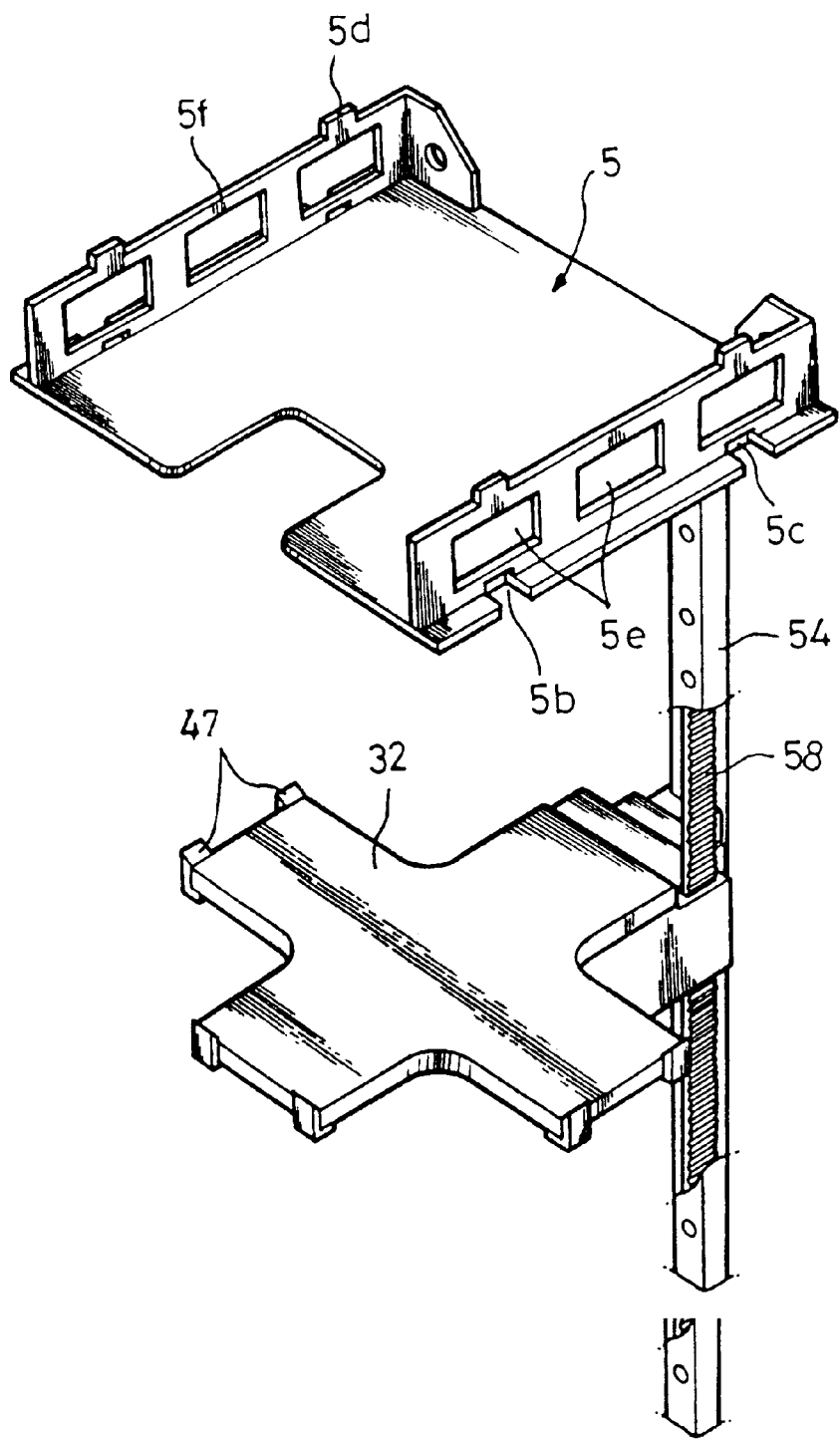
FIG. 11 is a perspective view of the downer and the pallets, these elements being disassembled.

Further, referring to FIG. 11, each pallet 5 has a recessed groove 5c formed at a bottom surface thereof, and a protrusion 5d formed at a top surface thereof corresponding to the recessed groove.

This configuration provides an accurately vertical position alignment of a plurality of pallets 5, when these pallets are vertically deposited one after the other, and further ensures that the deposited pallets 5 maintain their alignment during their ascending or descending movement.

Further, four corners of an upper plane of the downer 32 have positioning blocks 47 fixedly installed thereto, which blocks are used to re-position the pallet placed on the upper plane of the downer 32.

Further, locking means at the loading and unloading positions 19, 26 on the side plate 40 are provided for locking the top pallet exposed to the loading or unloading position, respectively. Also, the rotation position 30 between the loading side and unloading side elevator units 18a and 18b is provided for transferring the pallet having been placed at the loading and unloading positions 19 and 26 to a position over the loading side and unloading side elevation plate 36.

As shown in FIG. 8a, the locking means for locking the pallet 5 exposed to the loading or unloading position 19 or 20 is installed corresponding to the loading or unloading position, and consists of a pair of fingers 35 adapted to be horizontally moved for locking the bottom surface of the pallet, and a cylinder 48 having a rod coupled to one end of the finger and used to widen or narrow fingers.

The pair of fingers 35 are inwardly moved each other by a drive of the cylinder to support the bottom surface of the pallet when holding the pallet 5, and are opened not to interfere with the ascending motion of the elevation plate 36.

The transfer 31, which is used to transfer the pallet positioned at the loading or unloading position 19 or 26 into the rotation position 30, consists of: a transferring block 50 which is moved along the guide rail (not shown) disposed parallel to the loading or unloading position 19 or 26; an elevation plate 52 which ascends or descends by a drive of a cylinder 51 installed in the transferring block; a guide rod 53 inserted into the transferring block and fixed thereat and which guides the movement of the elevation plate 52; and fingers 33 widened or narrowed by a drive of a finger cylinder 34 installed at both sides of the elevation plate 52.

The fingers 33 hold bottom surfaces of the support members 5f through a hole 5e formed in both sides of the plate 5.

Further, in the rotation position 30 as shown in FIG. 6, the downer 32 used to move to the bottom dead point the pallet 5 transferred by the transfer 31 is inserted into the guide rail 54 in a cantilever fashion, by which an upward or downward movement within a range set by a second driving means is provided to the downer 32.

The second driving means for moving upward or downward the downer 32 may consist of: a motor 55 for generating dynamics; a timing belt 58 wound between a driving pulley 56 of the motor and the driven pulley 57; and a fixing block 59 fixed at the downer and thus timing belt 58.

Figure 10:
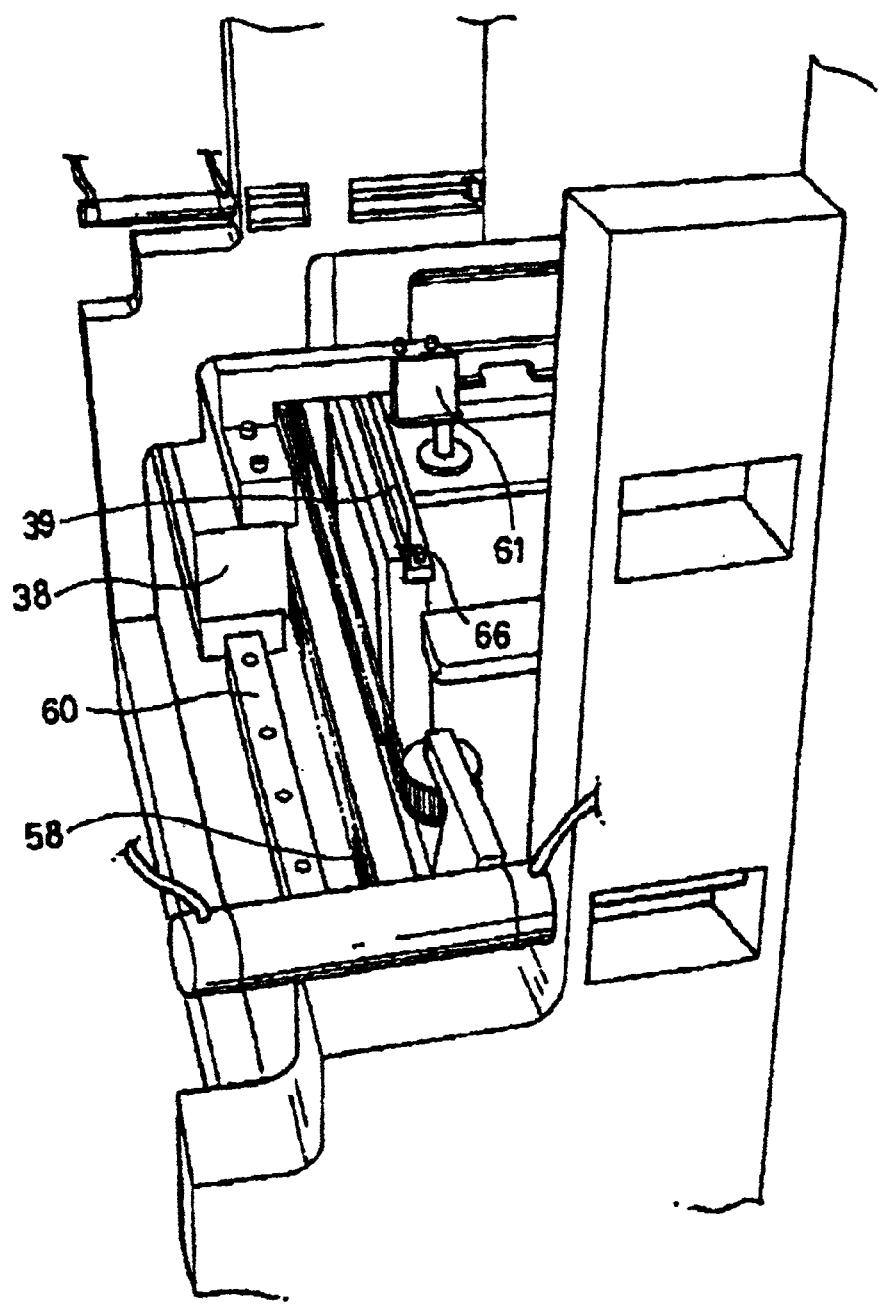
FIG. 10 is a perspective view of distribution means.

Referring to FIG. 10, distribution means installed at the bottom dead point of the rotation position 30 is used to transfer the pallet 5 from the downer 32 positioned at the bottom dead point to the loading or unloading elevator unit 18a or 18b. The distribution means may consists of: a guide rail 39 having the same level of a top surface thereof as that of the elevation plate 36 positioned at the bottom dead point; a slider 38 moved along another guide rail 60 fixed at an outer side of the guide rail 39; a pusher 61 fixed on one side surface of the slider, and for pushing the pallet 5 placed on the guide rail toward the loading or unloading elevator unit 18a or 18b; a third driving means for driving the slider.

The third driving means, as shown in FIG. 7, may consists of: a motor 62 for generating dynamics; a driving pulley 63 rotated by a drive of the motor; and a timing belt 65 wound between a driving pulley and the driven pulley, and for carrying the dynamics from the driving pulley into the driven pulley, further the belt 65 having a predetermined site for coupling the slider 38.

A bearing 66 upwardly projects from a top surface of the guide rail 39 placing thereon the pallet 5 which is moved downward by the downer 32. With the bottom surface of the pallet 5 coupled thereto, the bearing 66 is horizontally moved.

The operation of the apparatus according to the present invention thus constructed will be described in detail.

The operation of the apparatus starts when the pallets 5 are placed on the loading and unloading positions 19, 26. The loading side picking-up means 16 picks up the module IC 1 previously contained in the test tray 6 and loads it into the carrier 17, and thereafter, the carrier 17 carrying the module ICs to be tested is sequentially transferred to a heating chamber 23 by the transferring means.

After such operations are repeated until the test tray is depleted of the module IC to be held, an empty pallet is transferred to the rotation position 30 by moving left (as seen in FIG. 9b) the transferring block 50 of the transfer 31 along the guide rail. This action results in the placement of the elevation plate 52 onto the top dead point, and the opened state of the fingers 33.

At this time, the downer 32 at the bottom dead line ascends up to the top dead line along the guide rail 54 by a drive of the motor 55, and then waits until the transferring of an empty pallet is completed.

Under such circumstances, if the fingers 33 reach the bottom surface of the pallet 5 when the elevation plate 52, as shown in FIG. 9c, descends to the bottom dead point by a drive of the cylinder 51, the fingers 33 driven by the finger cylinder 34 are narrowed to hold the bottom surface of the pallet.

After an empty pallet having been placed at the loading position 19 is held by the fingers 33, the re-drive of the cylinder 51 moves the elevation plate 52 up to the top dead point, and the transferring block 50 is, as shown in FIG. 9d, transferred to the position over the downer 32 which is positioned at the rotation position 30 in a right side as seen in the drawing.

As described above, after an empty pallet 5, which was at the loading position 19, is transferred to the rotation position 30 by the transfer 31, the upward movement of the pallet 5 has to be made, which then requires the releasing of the locking means which has locked the pallet 5 in the loading position 19.

To accomplish this, the drive of the cylinders 48 positioned opposite to each other opens, as shown in FIG. 8a, a pair of fingers 35. Therefore, the fingers become positioned outside of the pallet so that interference with the ascending pallets does not occur.

During such an operation, an empty pallet having been held by the transfer 31 can be moved downward to the bottom dead point by a drive of the cylinder 51, and is released from its holding state due to the widening of the pair of fingers 33 occurring when the cylinder 34 drives them. Thus, the empty pallet can be placed on the top surface of the downer 32.

Thereafter, the elevation plate 52 again ascends to the top dead point by a drive of the cylinder.

An empty pallet which is placed on the top surface of the downer 32 is re-positioned by an action of the positioning blocks 47 respectively fixed at four corners of the downer.

At this time, the motor 43 as the first driving means in the loading side elevator unit 18a rotates the driven pulley 42 screwed into the lead screw 41 and which changes the rotational motion into a linear to-and-from motion that is then transmitted to the elevation plate 36 at the loading side. Therefore, the loading side elevation plate ascends, thereby the plurality of pallets 5 being moved to the top dead point, as shown in FIG. 9e.

The driving of the motor 32 can be controlled by sensing the top pallet 5 exposed to the loading position 19 through the use of a pair of sensors (not shown).

After all of the plural pallets 5 which were in the loading side elevator unit 18a are simultaneously moved upward toward the top dead point, the fingers 35 then shrunk by an action of the cylinder 38 locks the bottom surface of the pallet 5.

In other words, only one top pallet can be separated from the plural pallets 5 vertically deposited 6.

Thereafter, the motor 43 moves downwardly the loading side elevation plate 36 having been at the top dead point to the bottom dead point, as shown in FIG. 9f. Prior to such an action, since the stoppers 37 which remained opened (or protruded) are retracted by the cylinder 46, the downward movement of bottom pallet 5 is controlled by the retracted stopper 37 during the descending of the elevation plate 36, and therefore, only the loading side elevation plate 36 descends to the bottom dead point.

It is noted that since the loading side elevation plate 36 is provided with the cut grooves 36a for passing the stoppers 37, an interference with the retracted stoppers 37 does not occur.

During the descending operation of the loading side elevation plate 36 to the bottom dead point as discussed above, the downer at the top dead point of the rotation position 30 also descends to the bottom dead point by the motor 55. Specifically, since there is provided at the bottom dead point of the downer the guide rail 39 for placing thereon the pallet 5 which is placed on the downer and moved downward, an empty pallet 5 is separated from the downer 32 to be placed in the guide rail 39, and only downer descends to the bottom dead point.

At this time, the controller (not shown) controls the slider 38 which is moved for horizontally transferring the pallet 5 placed on the guide rail 39 toward the elevation plate 36 in the loading or unloading side, depending upon the loading position 10 or the unloading position 26 the pallet 5 has come from. In consideration of such an operation, the slider is positioned at the right or left side of the downer by the third driving means, prior to the downward movement of the downer 32.

As described above, the slider 38 is at the right side as seen in the drawing, in case the downer 32 moves downwardly the pallet 5 at the loading position 19.

The slider 38 at the right side in the drawing is then moved left as seen in the drawing by the motor 62 as the third driving means, as shown in FIG. 9h, after the pallet 5 is placed on the guide rail 39 as shown in FIG. 9g. Thus, the pallet on the guide rail is in turn placed on the top surface of the loading side elevation plate 36.

During such an operation, with the bottom surface of the empty pallet engaged with the bearing which is exposed to the top surface of the guide rail 39, the pusher 61 pushes the pallet toward the loading side elevation plate 38 according to the transfer action of the slider 38, which produces more smoother transferring operation.

After the slider 38 transfers the pallet placed on the guide rail 39 to the position over the loading side elevation plate 36, the slider 38 may wait for at that position or at another position moved right as seen the drawing, depending upon the loading position 10 or the unloading position 26 the descending pallet 5 by the downer 32 has come from.

While one embodiment is shown and described above which the transfer 31 holds the pallet 5 at the loading position 19 and then transfer to the rotation position 30, simultaneously therewith, the pallet 5 at the loading side elevator unit 18a is exposed to the loading position, and the pallet 5 at the rotation position 30 is transferred to the position over the loading side elevation plate 36, it will be appreciated that a circulation can be similarly made which circulates the pallet 5 containing therein the test-completed module ICs 1 from the unloading position 26 to the position over the unloading side elevation plate through the rotation position.

Compared with the prior module IC handler, the present invention provides the following advantages:

firstly, a minimal size in height of the apparatus can be provided in that the circulation is made which circulates the pallet 5 containing therein the test-completed module ICs 1 from the unloading position 26 to the position over the unloading side elevation plate through the rotation position;

secondly, an overall area occupied by the equipment can be reduced to a minimum in that an exposure of the pallet to the loading or unloading position 18 or 26 is possible even when the top pallet 5 in the loading side or unloading side elevator unit 18a or 18b ascends only to the top dead point; and finally, an availability of the high-cost apparatus is maximized in that since the pallet 5 deposited in the loading or unloading elevator unit 18a or 18b is sequentially circulated through the rotation position 30 even though all of the module ICs in the test tray 6 placed on each elevation plate 36 are loaded or the test-completed module ICs are filled in the customer tray 7, it becomes possible to re-use the apparatus by exchanging only the pallet at each elevator unit 19a or 18b.

What is claimed is:

1. A module integrated circuit (IC) test handler that includes a pallet circulating apparatus, comprising:
   an elevator unit comprising;
   an elevator elevation plate configured to raise and lower pallets stacked on the elevator elevation plate;
   a stopper unit disposed adjacent to a bottom of said elevator unit comprising a plurality of movable stopper fingers located on sides of the elevator unit outside a path of travel of the pallets when the stopper unit is in an open position, and in the path of travel of the pallets when the stopper unit is in a closed position such that when the stopper unit is in the open position, pallets are allowed to pass the stopper unit as the pallets are raised and lowered by the elevator elevation plate, and such that when the stopper unit is in the closed position, pallets are prevented from passing the stopper unit as the pallets are raised and lowered by the elevator elevation plate and further comprising apertures formed in the elevator elevation plate at positions corresponding to positions of the stopper fingers of the stopper unit such that when the stopper unit is in the closed position, the elevator elevation plate can still pass by the stopper unit;
   a lowering unit disposed adjacent to said elevator unit and configured to lower at least one pallet;
   a transfer apparatus disposed adjacent to a top of said elevator unit and a top of said lowering unit, and configured to transfer a pallet from the top of said elevator unit to the top of said lowering unit; and
   a distribution apparatus disposed adjacent to the bottom of said elevator unit and a bottom of said lowering unit, and configured to transfer a pallet from the bottom of said lowering unit to the bottom of said elevator unit.

2. The module IC test handler of claim 1, further comprising a locking unit disposed adjacent the top of said elevator unit, wherein the locking unit is configured such that when the locking unit is in an open position, pallets are allowed to pass the locking unit as the pallets are raised and lowered by the elevator elevation plate, and such that when the locking unit is in a closed position, the locking unit can hold a pallet in a loading position at the top of the elevator unit.

3. The module IC test handler of claim 1, wherein said lowering unit comprises:
   a downer plate configured to support a pallet as the pallet is lowered from the top of the lowering unit to the bottom of the lowering unit; and
   a downer actuation mechanism configured to move the downer plate between the top of the lowering unit and the bottom of the lowering unit.

4. The module IC test handler of claim 1, wherein said transfer apparatus comprises:
   a transfer elevation plate configured to move upward and downward, and to move between a position over the elevator unit and a position over the lowering unit; and
   transfer fingers attached to the transfer elevation plate and configured to grasp and release a pallet.

5. The module IC test handler of claim 4, wherein the transfer apparatus further comprises:
   a first actuation mechanism configured to move the transfer elevation plate upward and downward;
   a second actuation mechanism configured to move the transfer elevation plate between the position over the elevator unit and the position over the lowering unit; and
   a third actuation mechanism configured to cause the transfer fingers to move towards and away from each other to grasp and release a pallet.

6. The module IC test handler of claim 1, wherein the distribution apparatus comprises:
   a guide rail located at the bottom of the lowering unit and configured to support a pallet as the pallet is moved between a position at the bottom of the lowering unit and a position at a bottom of the elevator unit; and
   a pusher configured to push a pallet from the position at the bottom of the lowering unit to the position at the bottom of the elevator unit.

7. The module IC test handler of claim 6, wherein said lowering unit comprises a downer plate configured to support a pallet and to lower the pallet from the top of the lowering unit to the guide rail.

8. The module IC test handler of claim 6, wherein the distribution apparatus further comprises a distribution actuation mechanism configured to move the pusher.

9. The module IC test handler of claim 1, wherein the elevator unit comprises a loading side elevator unit, and further comprising an unloading side elevator unit, disposed adjacent to said lowering unit, and configured to raise and lower pallets, wherein said transfer apparatus is further configured to transfer a pallet from a top of said unloading side elevator unit to the top of said lowering unit, and wherein said distribution apparatus is further configured to transfer a pallet from the bottom of said lowering unit to a bottom of said unloading side elevator unit.

10. The module IC test handler of claim 9, wherein said transfer apparatus comprises:
    a transfer elevation plate configured to move upward and downward, and to move between a position over the loading side elevator unit, a position over the lowering unit and a position over the unloading side elevator unit; and
    transfer fingers attached to the transfer elevation plate and configured to grasp and release a pallet.

11. The module IC test handler of claim 10, wherein the transfer apparatus further comprises:
    a first actuation mechanism configured to move the transfer elevation plate upward and downward;
    a second actuation mechanism configured to move the transfer elevation plate between the position over the loading side elevator unit and the position over the lowering unit and the position over the unloading side elevator unit; and
    a third actuation mechanism configured to cause the transfer fingers to move towards and away from each other to grasp and release a pallet.

12. The module IC test handler of claim 9, wherein the distribution apparatus comprises:
    a guide rail, located at the bottom of the lowering unit and configured to support a pallet as the pallet is moved between a position at the bottom of the lowering unit and either a position at the bottom of the loading side elevator unit or a position at the bottom of the unloading side elevator unit; and
    a pusher configured to push a pallet from the position at the bottom of the lowering unit to either a position at the bottom of the loading side elevator unit or a position at the bottom of the unloading side elevator unit.

13. The module IC test handler of claim 12, wherein the distribution apparatus is configured such that when a pallet from the top of the loading side elevator unit is lowered to the bottom of the lowering unit, the pusher pushes the pallet to the bottom of the loading side elevator unit, and is further configured such that when a pallet from the top of the unloading side elevator unit is lowered to the bottom of the lowering unit, the pusher pushes the pallet to the bottom of the unloading side elevator unit.

14. The module IC test handler of claim 12, wherein said lowering unit comprises a downer plate configured to support a pallet and to lower the pallet from the top of the lowering unit to the guide rail.

15. The module IC test handler of claim 9, wherein the unloading side elevator unit comprises:
    an elevator elevation plate configured to raise and lower pallets that are stacked on the elevator elevation plate;
    stopper unit disposed adjacent to the bottom of the unloading side elevator unit, wherein the stopper unit is configured such that when the stopper unit is in an open position, pallets are allowed to pass the stopper unit as the pallets are raised and lowered, and such that when the stopper unit is in a closed position, pallets are prevented from passing the stopper unit as the pallets are raised and lowered.

16. The module IC test handler of claim 15, wherein the stopper unit of the unloading side elevator unit comprises a plurality of movable stopper fingers located on sides of the unloading side elevator unit, wherein the stopper fingers are located at positions outside the path of travel of the pallets when the stopper unit is in the open position, and wherein the stopper fingers are in the path of travel of the pallets when the stopper unit is in the closed position.

17. The module IC test handler of claim 16, wherein apertures are formed in the elevator elevation plate of the unloading side elevator unit at positions corresponding to positions of the stopper fingers of the stopper unit such that when the stopper unit is in the closed position, the elevator elevation plate can still pass by the stopper units.

18. A module integrated circuit (IC) test handler that includes a pallet circulating apparatus, comprising:
    a loading side elevator unit configured to raise and lower pallets;
    an unloading side elevator unit configured to raise and lower pallets;
    a lowering unit disposed between the loading side elevator unit and the unloading side elevator unit and configured to lower at least one pallet;
    a transfer apparatus disposed adjacent to a top of said loading side elevator unit, a top of said unloading side elevator unit and a top of said lowering unit, and configured to transfer a pallet from the top of either said loading side elevator unit or said unloading side elevator unit to the top of said lowering unit; and
    a distribution apparatus disposed adjacent to a bottom of said lowering unit, and configured to transfer a pallet from the bottom of said lowering unit to either a bottom of said loading side elevator unit or a bottom of said unloading side elevator unit.

19. The module IC test handler of claim 18, further comprising a locking unit disposed adjacent the top of said loading side elevator unit and a locking unit disposed adjacent the top of said unloading side elevator unit, wherein each locking unit is configured such that when the locking unit is in an open position, pallets are allowed to pass the locking unit as the pallets are raised and lowered, and such that when the locking unit is in a closed position, the locking unit can hold a pallet in a loading position at the top of the respective loading side elevator unit and unloading side elevator unit.

20. The module IC test handler of claim 18, wherein said transfer apparatus comprises:
    a transfer elevation plate configured to move upward and downward, and to move between a position over the loading side elevator unit, a position over the lowering unit and a position over the unloading side elevator unit; and transfer fingers attached to the elevation plate and configured to grasp and release a pallet.

21. The module IC test handler of claim 20, wherein the transfer apparatus further comprises:

a first actuation mechanism configured to move the transfer elevation plate upward and downward;

a second actuation mechanism configured to move the transfer elevation plate between the position over the loading side elevator unit, the position over the lowering unit and the position over the unloading side elevator unit; and a third actuation mechanism configured to cause the transfer fingers to move towards and away from each other to grasp and release a pallet.

22. The module IC test handler of claim 18, wherein the loading side elevator unit and unloading side elevator unit each comprise:

an elevator elevation plate configured to raise and lower pallets that are stacked on the elevator elevation plate;

stopper units disposed adjacent to the bottoms of the loading side elevator unit and the unloading side elevator unit, wherein the stopper units are configured such that when the stopper units are in an open position, pallets are allowed to pass the stopper units as the pallets are raised and lowered by the elevator elevation plate, and such that when the stopper units are in a closed position, pallets are prevented from passing the stopper units as the pallets are raised and lowered by the elevator elevation plate.

23. The module IC test handler of claim 22, wherein the stopper units of each of the loading side elevator unit and the unloading side elevator unit comprise a plurality of movable stopper fingers located on sides of each of the loading side elevator unit and the unloading side elevator unit, wherein the stopper fingers are located at positions outside the path of travel of the pallets when the respective stopper unit is in the open position, and wherein the stopper fingers are in the path of travel of the pallets when the respective stopper unit is in the closed position.

24. The module IC test handler of claim 23, wherein apertures are formed in the elevator elevation plates of the loading side elevator unit and the unloading side elevator unit at positions corresponding to positions of the stopper fingers of the respective stopper units such that when the respective stopper units are in the closed position, the elevator elevation plates can still pass by the stopper units.

25. The module IC test handler of claim 18, wherein the distribution apparatus comprises:

a guide rail located at the bottom of the lowering unit and configured to support a pallet as the pallet is moved between a position at the bottom of the lowering unit and either a position at the bottom of the loading side elevator unit or a position at the bottom of the unloading side elevator unit; and a pusher configured to push a pallet from the position at the bottom of the lowering unit to either a position at the bottom of the loading side elevator unit or a position at the bottom of the unloading side elevator unit.

26. The module IC test handler of claim 25, wherein the distribution apparatus is configured such that when a pallet from the top of the loading side elevator unit is lowered to the bottom of the lowering unit, the pusher pushes the pallet to the bottom of the loading side elevator unit, and is further configured such that when a pallet from the top of the unloading side elevator unit is lowered to the bottom of the lowering unit, the pusher pushes the pallet to the bottom of the unloading side elevator unit.

27. The module IC test handler of claim 25, wherein said lowering unit comprises a downer plate configured to support a pallet and to lower the pallet from the top of the lowering unit to the guide rail.

* * * * *